United States Patent
Visokay et al.

(10) Patent No.: US 6,750,126 B1
(45) Date of Patent: Jun. 15, 2004

(54) METHODS FOR SPUTTER DEPOSITION OF HIGH-K DIELECTRIC FILMS

(75) Inventors: Mark Visokay, Richardson, TX (US); James Joseph Chambers, Dallas, TX (US); Luigi Colombo, Dallas, TX (US); Antonio Luis Pacheco Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 10/338,276

(22) Filed: Jan. 8, 2003

(51) Int. Cl.[7] .................. H01L 21/3205; H01L 21/4763
(52) U.S. Cl. ........................................................ 438/585
(58) Field of Search ................................. 438/585, 785, 438/243, 386

(56) References Cited

U.S. PATENT DOCUMENTS

| | | |
|---|---|---|
| 5,482,612 A | 1/1996 | Armstrong et al. |
| 5,580,428 A | 12/1996 | Krivokapic et al. |
| 6,159,835 A | 12/2000 | Visokay et al. |
| 6,184,072 B1 | 2/2001 | Kaushik et al. |
| 6,251,761 B1 | 6/2001 | Rodder et al. |
| 6,271,094 B1 | 8/2001 | Boyd et al. |
| 6,303,940 B1 | 10/2001 | Kizilyalli et al. |
| 6,380,104 B1 | 4/2002 | Yu |
| 6,407,435 B1 | 6/2002 | Ma et al. |
| 6,444,592 B1 | 9/2002 | Ballantine et al. |
| 6,448,127 B1 | 9/2002 | Xiang et al. |
| 6,455,330 B1 | 9/2002 | Yao et al. |
| 2002/0058424 A1 | 5/2002 | Rotondaro |
| 2002/0081826 A1 | 6/2002 | Rotondaro |
| 2002/0146915 A1 * | 10/2002 | Narwankar et al. ......... 438/785 |

* cited by examiner

Primary Examiner—Craig A. Thompson
(74) Attorney, Agent, or Firm—Jacqueline J. Garner; W. James Brady, III; Frederick J. Telecky, Jr.

(57) ABSTRACT

Methods are disclosed for fabricating transistor gate structures and high-k dielectric layers therefor by sputter deposition, in which nitridation and/or oxidation or other adverse reaction of the semiconductor material is reduced or minimized by reducing the bombardment of the semiconductor body by positively charged reactive ions such as oxygen ions or nitrogen ions during the sputter deposition process. The sputtering operation may be a two-step process in which ionic bombardment of the semiconductor material is minimized in an initial deposition step to form a first layer portion covering the semiconductor body, and the second step completes the desired high-k dielectric layer. Mitigation of unwanted nitridation and/or oxidation or other adverse reaction is achieved through one, some, or all of high sputtering deposition pressure, repulsive wafer biasing, increased wafer-plasma spacing, low partial pressures for reactant gases, and low sputtering powers or power densities.

52 Claims, 6 Drawing Sheets

METHODS FOR SPUTTER DEPOSITION OF HIGH-K DIELECTRIC FILMS

FIELD OF INVENTION

This invention relates generally to semiconductor devices and more particularly to methods for sputter deposition of high-k dielectric materials for transistor gate fabrication in the manufacture of semiconductor devices.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a metal or polysilicon gate contact or electrode is energized to create an electric field in a channel region of a semiconductor body, by which current is allowed to conduct between a source region and a drain region of the semiconductor body. The source and drain regions are typically formed by adding dopants to targeted regions on either side of the channel region in a semiconductor substrate. A gate dielectric or gate oxide, such as silicon dioxide ($SiO_2$), is formed over the channel region, typically by thermal oxidation. A gate electrode or gate contact (e.g., metal or doped polysilicon) is then formed over the gate dielectric, and the gate dielectric and gate electrode materials are then patterned to form a gate structure overlying the channel region of the substrate.

The gate dielectric is an insulator material, which prevents large currents from flowing from the gate into the channel when a voltage is applied to the gate electrode, while allowing such an applied gate voltage to set up an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which thickness of gate dielectrics formed of $SiO_2$ can be reduced. For example, very thin $SiO_2$ gate dielectrics are prone to large gate tunneling leakage currents resulting from direct tunneling through the thin gate oxide. In addition, there are conventional limitations on the ability to form such thin oxide films with uniform thickness. Furthermore, thin $SiO_2$ gate dielectric layers provide a poor diffusion barrier to dopants, for example, and may allow high boron dopant penetration into the underlying channel region of the silicon during fabrication of the source/drain regions.

Recent efforts directed to MOS device scaling have accordingly focused on alternative dielectric materials which can be formed in a thicker layer than scaled $SiO_2$, and yet which produce equivalent field effect performance. These materials have dielectric constants greater than that of $SiO_2$ and are commonly referred to as high-k materials or high-k dielectrics. The relative performance of these high-k materials is often expressed as equivalent oxide thickness (EOT), because the alternative material layer may be thicker, while still providing the equivalent electrical effect of a much thinner layer of $SiO_2$. Because the dielectric constant is higher, a thicker high-k dielectric layer can be deposited to avoid or mitigate tunneling leakage currents, while still achieving the required value of EOT that is comparable to the EOT value of a thinner layer of thermally grown $SiO_2$.

High-k dielectrics are typically deposited directly over a silicon substrate to form a gate dielectric layer using chemical vapor deposition (CVD), atomic layer deposition (ALD), or physical vapor deposition (PVD) processes. One particular form of PVD deposition involves sputtering, wherein high-k dielectric films may be formed over silicon substrates in a sputtering chamber. Many high-k materials explored thus far include oxygen and/or nitrogen components, such as oxides, oxynitrides, or nitrides. In sputter deposition of such materials, the silicon substrate reacts with the oxygen and/or nitrogen, resulting in oxidation and/or nitridation at the interface between the substrate and the high-k gate dielectric. The performance and reliability of the resulting transistors, in turn, is dependent upon the quality of the interface between the high-k gate dielectric material and the underlying silicon, wherein oxidation or nitridation at the interface inhibits the ability to scale device dimensions and may degrade device performance.

For instance, excessive reaction of silicon during sputter deposition of oxides or oxynitrides causes formation of undesirable interface layers of $SiO_2$-like material having a relatively low dielectric constant, resulting in increased EOT and thereby limiting scalability. In such a case, the upper surface of the silicon substrate oxidizes during the initial stages of the deposition process, causing formation of an unintended low quality oxide layer between the substrate and the subsequently deposited high-k material. In some cases, the unintended interface can be as much as 30 Å thick, wherein the unintended low-k interface layer increases the EOT of the resulting gate structure, and therefore inhibits scalability. Furthermore, this unintended interface generally has uncompleted bonds, that act as interface charging centers, causing interface states. The high density of such interface states in the low quality oxide results in carrier mobility degradation in operation of the transistor, where the higher the density of the interface states, the greater the resulting mobility degradation. Moreover, the unintended oxide (e.g., SiO or $SiO_2$) typically has defects, which degrade properties. In the case of high-k nitride and oxynitride materials, surface nitridation of the silicon during sputter deposition limits or inhibits carrier mobility in the resulting transistor.

Thus, transistor performance and scalability are degraded for conventional sputter deposition of high-k oxides, oxynitrides, and nitrides. Such conventional sputtering techniques employ relatively low pressures (less than about 3–5 mTorr) with relatively high partial pressures of reactant gases, short distances between the sputtering target and the wafer surface, and unbiased wafers. Attempts to combat the unintended oxidation and/or nitridation at the Si/high-k interface include the formation of an intentional interface buffer layer, such as a high quality $SiO_2$ over the silicon substrate, prior to depositing the high-k material. However, this approach requires additional processing steps and creation of the buffer layer presents other processing challenges. Moreover, the intentional $SiO_2$ buffer layer has a relatively low dielectric constant, whereby the goal of reduced EOT becomes more difficult and scalability is limited.

Therefore, there is a need for improved gate fabrication techniques by which high quality interfaces can be achieved between the underlying silicon and deposited high-k dielectrics without the need for formation of an intentional interface buffer layer, and which avoid or mitigate excessive reaction with reactant gases in a PVD sputter deposition operation.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for fabricating transistor gate structures and high-k dielectric layers therefor by sputter deposition of oxides, oxynitrides, or nitrides, in which nitridation and/or oxidation or other adverse reaction of the semiconductor material is reduced or minimized by reducing the bombardment of the semiconductor body by positively charged reactive ions, such as positively charged oxygen ions, nitrogen ions, or any positively charged ions causing adverse reaction with the silicon or other semiconductor body surface, during the sputter deposition process.

In accordance with various aspects of the invention, reduction of the undesirable nitridation and/or oxidation is achieved through use of high sputtering deposition pressure, repulsive wafer biasing, increased wafer-plasma spacing, low partial pressures for reactant gases, and/or low sputtering powers or power densities, alone or in combination. High sputter deposition pressure is employed to reduce the mean free path of oxygen or nitrogen or other reactive ions, thereby reducing the likelihood of such ions hitting the wafer and reacting therewith during high-k deposition. Wafer biasing is employed to repel or retard the kinetic energy of positively charged oxygen or nitrogen ions away from the wafer, by which unwanted reaction between such ions and the substrate can be reduced.

Increasing the spacing of the wafer relative to the sputtering target, and hence to the process plasma, facilitates neutralization of oxygen or nitrogen ions before they strike the wafer surface. Low partial pressures of reactant oxygen and/or nitrogen gases is employed during sputtering to minimize or reduce the amount of ions available to cause undesirable oxidation and/or nitridation of the wafer surface. Low sputtering power settings are employed to reduce the density of oxygen and/or nitrogen material hitting the wafer surface.

In accordance with another aspect of the invention, the sputtering operation may be a two-step process in which one or more of the above techniques are employed to reduce ionic bombardment of the semiconductor material and hence to minimize unwanted reaction with the substrate in an initial deposition step to form a first high-k dielectric layer portion covering the semiconductor body. A second step is then employed to complete deposition of the desired high-k gate dielectric layer.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
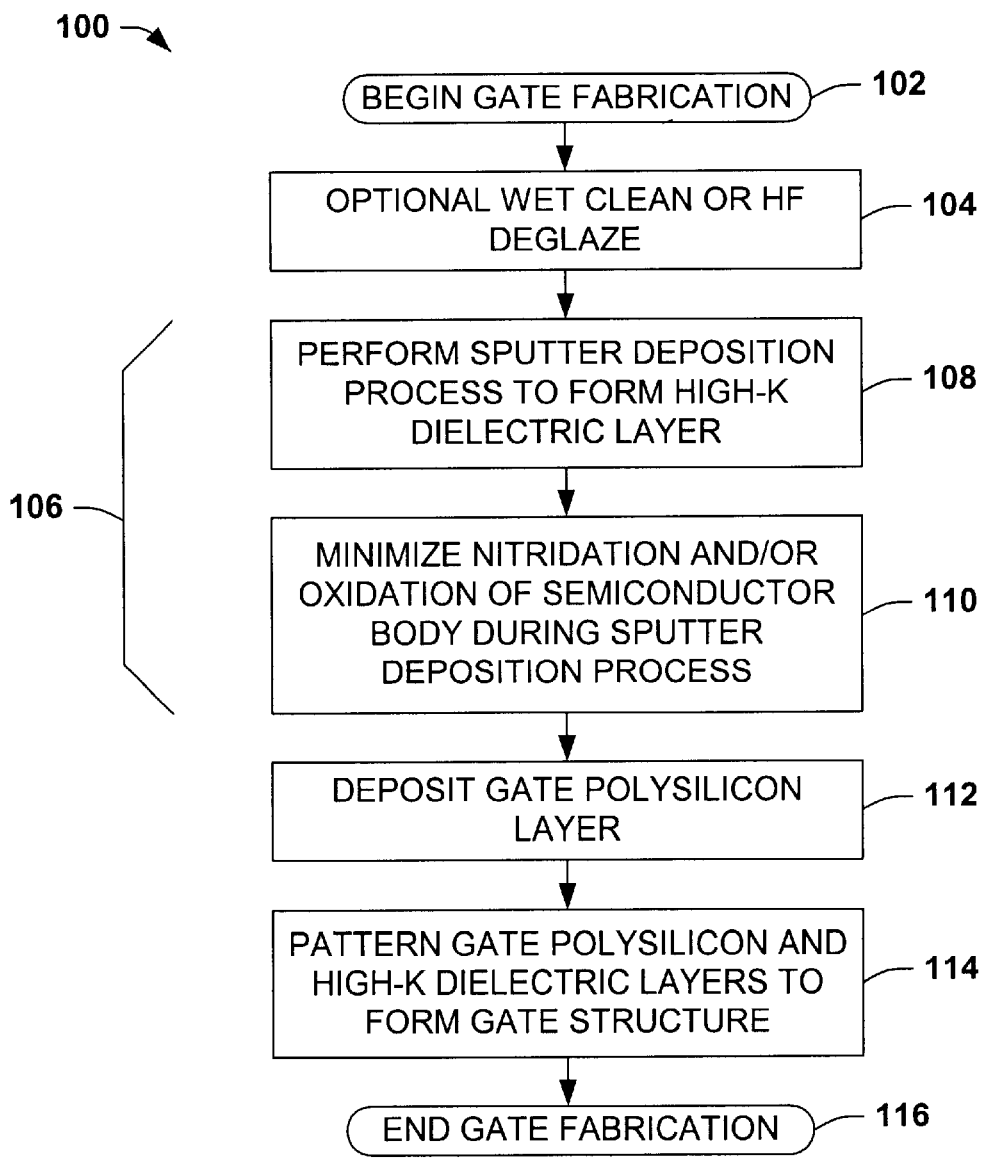
FIG. 1 is a flow diagram illustrating an exemplary method of fabricating transistor gate structures including high-k materials in accordance with one or more aspects of the present invention.

One or more implementations of the present invention will now be described with reference to the attached drawings, wherein like reference numerals are used to refer to like elements throughout. The invention relates to methods for fabricating gate structures in a semiconductor device, which may be employed in association with any type of semiconductor body, including silicon or other semiconductor substrates, as well as silicon or other semiconductor layers overlying an insulator region or layer in an SOI device.

The inventors have appreciated that mobility, scalability, and other performance issues are negatively impacted by reaction of a silicon surface over which high-k gate dielectric films are being deposited with reactants such as oxygen and nitrogen. Moreover, the inventors have found that conventional high-k sputter deposition techniques yield excessive nitridation and/or oxidation or other reaction of the wafer surface in sputter deposition of oxides, oxynitrides, or nitrides. This excessive reaction with the wafer surface can result in, for instance, increased EOT due to interface oxidation in the case of oxide or oxynitride films, and/or reduced mobility due to interface nitridation in the case of oxynitride or nitride films, both of which lead to degradation of device performance. While not wishing to be tied to any particular theory, it is believed that these problems are primarily the result of positively charged oxygen, nitrogen, or other reactive ions reacting with the wafer surface during initial stages of sputter deposition. Whereas prior techniques attempted to address these problems through formation of an $SiO_2$ buffer layer prior to high-k deposition, the present invention provides methods for sputter deposition of high-k dielectric films directly over a semiconductor body such as silicon wafers or SOI wafers without the need for such a buffer layer.

Physical vapor deposition (PVD) operations, including evaporation and sputtering, are thin film deposition processes in the gas phase, wherein source material is physically transferred to the substrate wafer without any chemical reactions involved. Sputtering involves bombardment of a solid source material referred as the target with high energy chemically inert (e.g., Ar) ions extracted from a plasma. The collision of the high energy Ar ion particles with the exposed solid target surface causes ejection of target atoms, which are then redeposited on the surface of the wafer substrate located in the vicinity of the target. Sputter deposition thus involves generation of ions and direction of the ions toward the target, sputtering of target atoms, transportation of sputtered atoms to the wafer, and condensation of the target atoms to form a film on the wafer.

Figure 12:
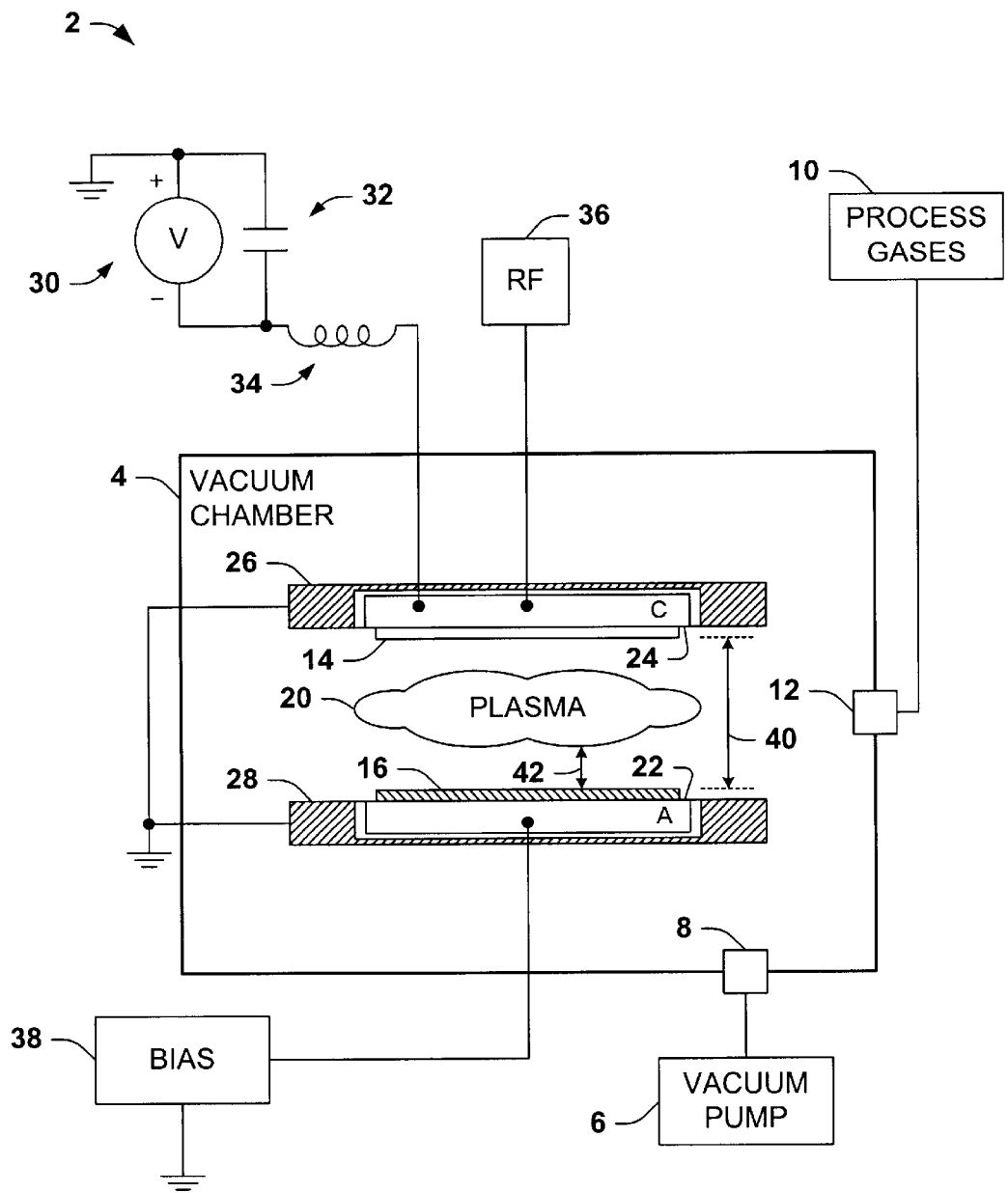
FIG. 12 is a simplified schematic diagram illustrating a sputtering system in which one or more aspects of the invention may be carried out.

Sputtering systems typically include a chamber in which a solid target material is located proximate a cathode and the wafer is located proximate an anode. Referring initially to FIG. 12, an exemplary sputtering system 2 is illustrated, in which various aspects of the present invention may be carried out. The system 2 includes a vacuum chamber 4, which is initially evacuated by a vacuum pump 6 via a chamber outlet 8 and filled with one or more process gases 10 at low pressures via an inlet 12. The process gases 10 typically include inert Ar gas, and may also include one or more reactant gases, depending on the high-k material to be deposited. For example, oxygen and/or nitrogen or other reactant gases 10 may be provided at respective partial pressures for sputter deposition of oxides, oxynitrides, and/or nitrides. This technique is sometimes referred to as reactive sputtering, wherein the introduction of reactive gases 10 into the sputtering chamber 4 allows material (e.g., target atoms) sputtered from a target 14 to combine with such reactive gases 10, in order to provide compound materials for deposition onto a wafer 16. Thus, compound high-k films such as hafnium oxide ($HfO_2$), hafnium oxynitride (HfON), hafnium silicon oxynitride (HfSiON) and others may be formed using a hafnium or hafnium silicide target 14 with the addition of oxygen and/or nitrogen reactant gases 10 at partial pressures. In certain cases, compound solid targets 14 may be sputtered, with additional reactant gases 10 being added to the process to compensate for any loss of gaseous constituents of the compound if the sputtering target material dissociates.

A glow discharge provides an ion source, such as a self-sustaining plasma 20 comprising a partially ionized gas with an equal number of positively charged ions (e.g., cations) and negatively charged ions (e.g., anions), as well as a number of non-ionized particles (e.g., neutrals). The plasma 20 is established between an electrical wafer chuck anode 22 and a cathode 24 at the target 14 inside the sputtering chamber 4, where the cathode 24 is partially surrounded by an ion sheath 26 coupled with a system ground, and the anode 22 is partially surrounded by a grounded sheath 28. The plasma 20 is a self-contained part of the electrical discharge in gases consisting of generally equal concentrations of ions and electrons. The plasma 20 thus contains electrically active species, but as a whole is electrically neutral, wherein ions can be extracted from the plasma 20 for use in sputtering target atoms from the surface of the target 14.

The cathode 24 and the target 14 may be negatively biased via a DC power source 30, a capacitor 32, and an inductor 34, or RF biased via an RF power source 36 in the system 2. Also, the anode 22 may be biased with respect to the system ground via a bias power source 38 in accordance with an aspect of the invention. The system 2 also includes control apparatus (not shown) in order to carry out sputter deposition to implement the various techniques described herein. Further, the system 2 may be provided with appropriate magnets and controls therefor to permit magnetron sputtering operations. The various methods of the present invention may be implemented using any form of sputtering process, such as DC sputtering, RF sputtering, magnetron sputtering, or others.

Referring also to FIG. 1, an exemplary method 100 is illustrated for fabricating a transistor gate structure in accordance with one or more aspects of the present invention. The methods of the current invention provide for adjusting the deposition process to be more gentle to the silicon substrate surface, by which an improved interface is achieved between deposited high-k dielectric material and the substrate. Although the method 100 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication and/or processing of the transistor gate structures and high-k dielectric films therefor which are illustrated and described herein as well as in association with other structures and films not illustrated.

Gate fabrication in the method 100 begins at 102, where a wet clean or HF deglaze operation may optionally be performed at 104 to clean a top surface of the semiconductor body (e.g., wafer 16 in FIG. 12) before sputter deposition of a high-k dielectric film at 106. The precleaning at 104 may be employed for removal of any thin dielectric layers from the silicon body, such as silicon oxide (SiO), silicon nitride (SiN), or silicon oxynitride (SiON). For removing SiO, wet cleaning operations can be performed at 104, or a dilute HF solution may be employed to deglaze the semiconductor body. One example of such an HF deglaze involves dipping the semiconductor in a 1:100 volume dilution of 49% HF at room temperature for a duration that is adequate to completely remove any SiO from the surface. In another example, a dry process is employed comprising a mixture of anhydrous HF and isopropyl-alcohol to remove SiO.

The high-k deposition at 106 comprises performing a sputter deposition process at 108 to form a high-k dielectric layer over a semiconductor body in a wafer. In one example, the high-k dielectric layer comprises a high-k oxide, oxynitride, or nitride, such as hafnium oxide ($HfO_2$), hafnium oxynitride (HfON), hafnium silicon oxynitride (HfSiON) or others, using a hafnium or hafnium silicide target with the addition of oxygen and/or nitrogen or other reactant gases at partial pressures. The sputtering process at 108 may employ high sputtering deposition pressure, repulsive wafer biasing, increased wafer-plasma spacing, low partial pressures for reactant gases, and/or low sputtering powers or power densities, alone or in combination, as discussed further below.

Although particularly useful with oxides, oxynitrides, and/or nitrides, the method 100 and other methods of the present invention may be carried out for deposition of any type of high-k dielectric materials at 108. Such high-k materials may include, but are not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate as are known in the art.

The high-k deposition 106 further comprises reducing or minimizing nitridation, oxidation, or other adverse reaction of the semiconductor material at 110 while performing the high-k sputter deposition. In one example, such reactions are reduced through minimization of bombardment of the semiconductor body by positively charged oxygen ions or nitrogen or other reactive ions during the sputter deposition process 108, as described further hereinafter. A gate electrode layer, such as metal or polysilicon is then deposited at 112 over the high-k dielectric layer, and the gate electrode layer and the high-k dielectric layer are patterned at 114 to form a gate structure, before the gate fabrication method 100 ends at 116.

In order to reduce adverse reaction of the wafer surface, and thereby to improve the interface between the semiconductor body and the high-k gate dielectric material, one or more techniques may be employed at 106, which are believed to reduce the amount of positively charged reactive ions, such as positively charged oxygen and/or nitrogen ions, impacting the wafer surface. Toward that end, one, some or all of these techniques may be employed separately or in combination during sputter deposition in accordance with the invention. In one implementation, performance of the sputter deposition process at 108 comprises controlling the sputtering chamber pressure (e.g., controlling the vacuum pump 6 or flow rates of process gases 10 in the exemplary sputtering system 2 of FIG. 12). In this case, minimizing bombardment of the semiconductor body at 110 comprises controlling the chamber pressure to be about 10 mTorr or more and about 100 mTorr or less. In a preferred implementation, the chamber pressure is controlled at 106 to be about 10 mTorr or more and about 30 mTorr or less.

Whereas conventional sputtering processes employed relatively low process pressures (e.g., less than about 3–5 mTorr) to improve deposition rate and uniformity, the high pressure according to this aspect of the invention facilitates reduction in the mean free path of all the species, ions and neutrals. Lowering the mean free path reduces the distance, on average, that a particular atom can travel before it collides with another atom. In this manner, the neutral species will have less energy if they impact the wafer surface. Furthermore, the ionized species are less likely to hit the surface and more likely to be neutralized, due to the reduced mean free path. For oxygen and nitrogen ions, the increase in pressure is believed to increase the likelihood of neutralization by increasing the probability of collisions, and if these ions are neutralized before striking the wafer, they will react and interact less with the wafer. Also, any energized neutrals which do impact the wafer surface, do so with less energy, because of an increased likelihood of collisions in which energy is lost.

Another aspect of the invention involves repulsive wafer biasing, in which the wafer is biased so as to repel or reduce or retard the kinetic energy of positively charged ions, such as oxygen and nitrogen, by which unwanted reaction thereof with the substrate can be reduced. This aspect may be employed alone or in combination with any or all of the other processing aspects of the invention as described herein. In one implementation, performing the sputter deposition process at 108 includes biasing the wafer with respect to the plasma potential (e.g., the potential of the plasma 20 in FIG. 12). In this case, the minimization of ionic bombardment at 110 comprises biasing the wafer positive with respect to the plasma potential to repel and/or retard the kinetic energy of positively charged oxygen, nitrogen, or other reactive ions away from the wafer during the sputter deposition process.

In one example, this may be accomplished by controlling the biasing of the wafer with respect to a sputter deposition system ground, such as using the bias power source 38 in FIG. 12. The plasma potential with respect to ground is generally negative with respect to ground and is related to the process pressure, the plasma species, the chemistry, and the power during sputter deposition. The biasing control of the present invention provides for a repulsive bias between the plasma and the wafer, so as to repel and/or retard or reduce the kinetic energy of positively charged ions, thereby lessening the likelihood of ionic reactions with the wafer surface. For example, the bias applied by the source 38 of FIG. 12 is controlled such that the wafer 16 is at a higher potential than the plasma 20, wherein the potential of the wafer 16 and the anode 22 with respect to system ground may be positive, zero, or negative. Thus, whereas prior sputtering techniques provided no biasing or biasing which attracted positively charged ions to the wafer, the biasing of the present invention repels or reduces the kinetic energy of positively charged reactive ions during high-k dielectric sputter deposition, thereby mitigating oxidation and/or nitridation or other adverse reaction at the high-k/silicon interface.

Another aspect of the invention involves increasing the spacing of the wafer at 106 relative to the sputtering target (e.g., and hence the spacing of the wafer relative to the process plasma) to facilitate neutralization of oxygen, nitrogen, or other reactive ions before they strike the wafer surface. In one implementation, the spacing 40 in the system 2 of FIG. 12 between the wafer 16 and the target 14 may be set to about 100 mm or more. Compared with conventional dielectric material sputtering processes where spacings of about 50 mm or less are typical, the increased spacing provides a reduction of oxidation and/or nitridation or other reaction of the silicon since fewer reactant ions will impinge the silicon surface during sputtering. This aspect may be employed using any appropriate sputtering equipment, such as those manufactured by Trikon Technologies GmbH of Germany and Applied Materials of Santa Clara, Calif., wherein wafer to target spacings 40 of, for example, 245 mm and 435 mm are possible within the scope of the invention. Other distances are possible as may be available from other equipment suppliers. This provides increased spacing 42 between the wafer 16 and the plasma 20 in the exemplary system 2 of FIG. 12 to reduce the energy of positively charged oxygen ions or nitrogen ions hitting the wafer 16 during the sputter deposition process.

Another possible implementation involves control of the partial pressures of reactant oxygen and/or nitrogen or other reactant gases introduced into the sputtering chamber during high-k deposition at 106, which may be employed separately or in combination with the other techniques described herein. For example, in the system 2 of FIG. 12, oxygen and/or nitrogen gases 10 are introduced at certain flow rates and partial pressures to obtain deposition of compound films such as oxides, nitrides, or oxynitrides. In this aspect of the invention, the reactant gas partial pressures are reduced to minimize or limit the number of reactant ions available to cause undesirable oxidation and/or nitridation or other adverse reaction of the surface of the wafer 16. In one implementation, minimization of ionic wafer bombardment comprises controlling a pressure of one or more reactant gases (e.g., partial pressure) to about 0.1 mTorr or less, preferably about 0.01 mTorr or less, in order to reduce the amount of positively charged oxygen ions or nitrogen ions hitting the wafer during the sputter deposition process.

Reduced reactant gas partial pressures for oxygen and/or nitrogen lessens the amounts of these materials in the deposition process, such that there will be much lower density of nitrogen or oxygen ions. This, in turn, reduces the amount or likelihood of wafer surface nitridation and oxidation, wherein the majority of ions impinging upon the wafer surface will be non-reactive (e.g., Ar). As discussed above, reducing the oxidation and nitridation improves device performance and enhances the ability to scale transistor dimensions. In this regard, partial pressures below 0.1 mTorr and those below 0.01 mTorr have been found to mitigate or avoid undesired surface reactions, while providing enough of the reactant species (e.g., oxygen and/or nitrogen) to obtain the desired film composition (e.g., oxide, oxynitride, nitride, etc.).

Another aspect of the invention employs low sputtering power settings to reduce the density of oxygen and/or nitrogen material hitting the wafer surface. For example, the sputtering power density in $W/cm^2$ is controlled (e.g., by control of the power sources 30 and/or 36 in FIG. 12) during sputtering to a level of about 0.11 $W/cm^2$ or less, preferably 0.01 $W/cm^2$ or less. The inventors have found that reducing the process power density reduces the density of reactant material hitting the surface of the wafer. In one example, a sputtering power of about 100 W or less is employed for a target area of about 900 $cm^2$, thus providing a power density of about 0.11 $W/cm^2$, whereas conventional sputtering processes are usually performed with power settings in the kW range for comparable target areas. As with the other aspects described herein, the reduced process power densities may be employed alone or in combination with the other features of the present invention, and all such combinations are contemplated as falling within the scope of the invention.

Figure 2:
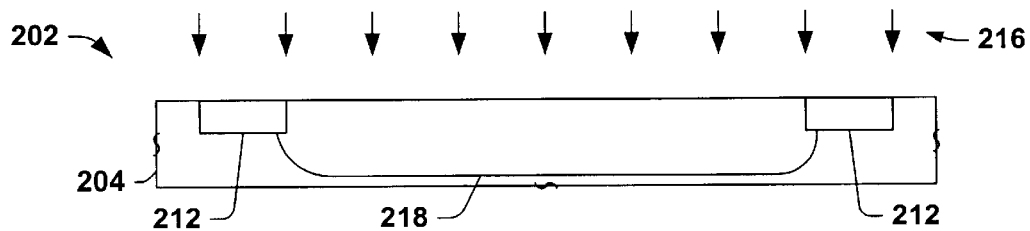
FIGS. 2–5 are partial side elevation views in section illustrating an exemplary semiconductor device being processed at various stages of manufacturing in accordance with various aspects of the invention.

Referring now to FIGS. 2–5, an exemplary semiconductor device 202 is illustrated undergoing processing at various stages of manufacturing in accordance with various aspects of the invention. As shown in FIG. 2, the device 202 comprises a wafer having a semiconductor body 204 therein, such as a silicon substrate or a layer of silicon overlying an insulator in an SOI device wafer. In the illustrated example, the semiconductor body 204 is a lightly doped p-type silicon substrate. In FIG. 2, isolation structures 212 (e.g., $SiO_2$) are formed in the body 204 via an isolation process (e.g., STI, LOCOS or other, not shown), which separate and provide electrical isolation between active areas. One or more p and/or n-type wells are then formed in the semiconductor body 204, including an n-well 218, and an optional wet clean or HF deglaze operation 216 may be performed to clean the top surface of the semiconductor body 204.

Figure 3:
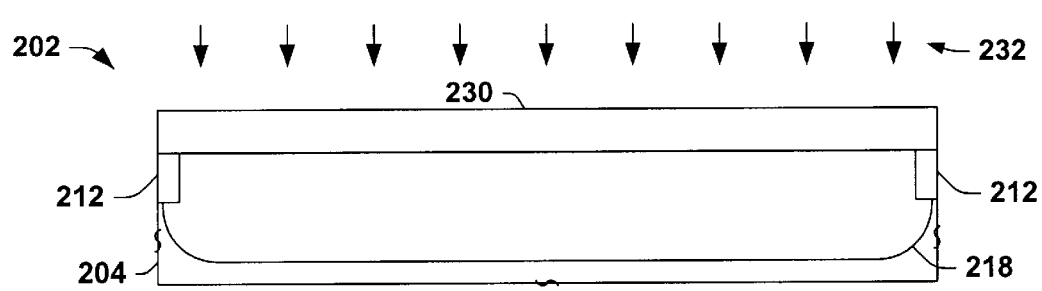

In FIG. 3, gate fabrication processing begins with the sputter deposition of a high-k dielectric layer 230 over the semiconductor body 204 via a PVD sputter deposition process 232 as described above. The high-k dielectric layer 230 comprises any appropriate high-k dielectric material, such as those mentioned above, formed to any desired thickness, such as 15–50 Å, for example 20–25 Å. During the sputtering process 232, undesirable nitridation and/or oxidation of the silicon at the interface between the high-k material 230 and the semiconductor body 204 is minimized or mitigated through use of high sputtering deposition pressure, repulsive wafer biasing, increased wafer-plasma spacing, low partial pressures for reactant gases, and/or low sputtering powers or power densities, alone or in combination, as described above.

Figure 4:
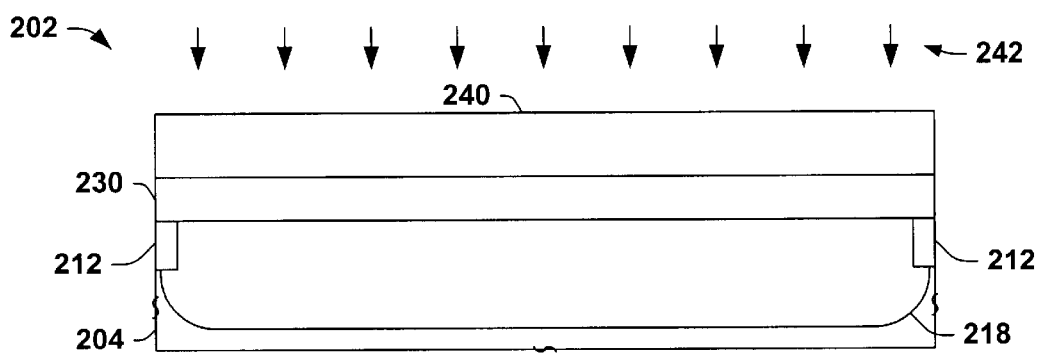
Figure 5:
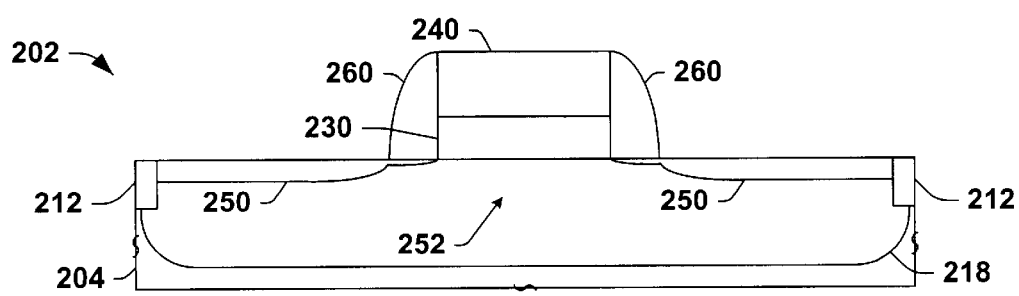
Figure 8:
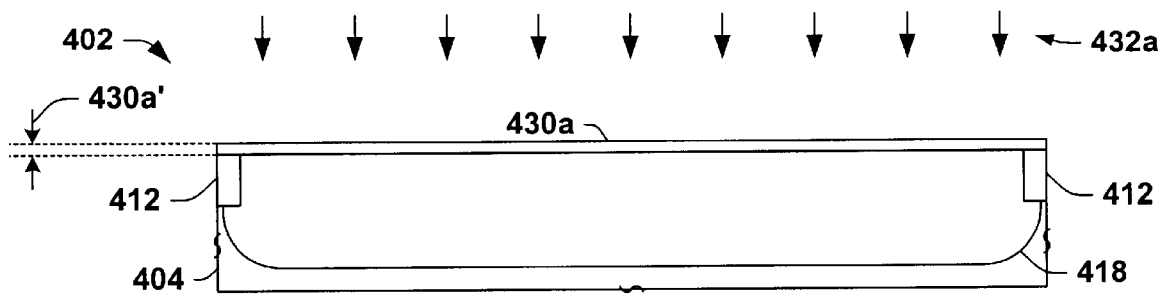

In FIG. 4, a gate electrode layer 240, such as metal or polysilicon is deposited over the high-k material 230 via a deposition process 242. As illustrated in FIG. 5, the gate electrode layer 240 and the high-k dielectric layer 230 are then patterned to form a transistor gate structure. Source/drain regions 250 are doped with p-type impurities on either side of a channel region 252 in the semiconductor body 204, and sidewall spacers 260 are formed along the sides of the patterned layers 220, 230, and 240 as illustrated in FIG. 8. Thereafter, interconnect processing (not shown) is performed to interconnect the illustrated MOS type transistor and other electrical components in the device 202.

Figure 6:
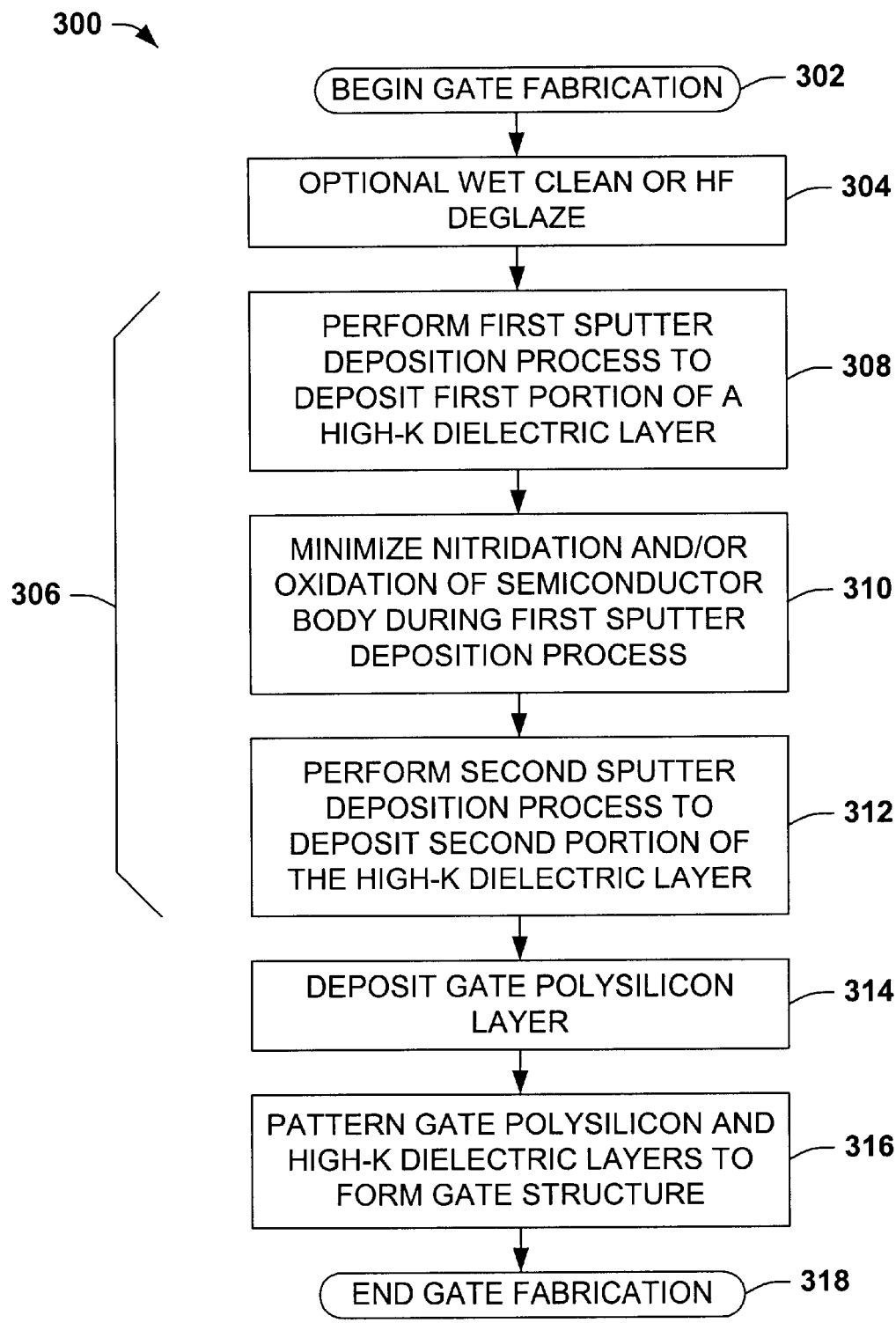
FIG. 6 is a flow diagram illustrating another exemplary method of fabricating transistor gate structures including a two-step sputter deposition of high-k materials in accordance another aspect of the present invention.

Referring now to FIG. 6, another aspect of the invention provides a two-step or multi-step sputter deposition of high-k dielectric material, which may be performed in-situ or in different tools. In this aspect, the sputter deposition process comprises depositing a first portion of the high-k dielectric layer covering the semiconductor body by sputter deposition, and depositing a second portion of the high-k dielectric layer over the first portion by sputter deposition, in which bombardment of the semiconductor body by positively charged oxygen, nitrogen or other reactive ions is reduced or minimized while depositing the first portion of the high-k dielectric layer.

An exemplary method 300 is illustrated in FIG. 6 according to this aspect of the invention, wherein gate fabrication begins at 302 and precleaning of the semiconductor body is optionally performed at 304 by wet cleaning or HF deglazing as described above. A high-k dielectric material (e.g., such as any of the high-k materials mentioned above) is then deposited at 306 via first and second sputter deposition processes at 308 and 312, respectively, where nitridation and/or oxidation or other adverse reactions are minimized or reduced at 310 during the first sputter deposition process. The minimization of unwanted reactions at 308 may include any of the techniques described above, alone or in combination, such as high sputtering deposition pressure, repulsive wafer biasing, increased wafer-plasma spacing, low partial pressures for reactant gases, and/or low sputtering powers or power densities.

Depending upon the minimization techniques employed during the first deposition process at 308, this step may achieve only a low deposition rate. However, the first high-k portion formed thereby need only cover the semiconductor material of the wafer, wherein the second step may but need not employ such oxidation or nitridation or other reaction reduction techniques. Thus, multi-step implementations are possible where a thin first portion is provided at a low deposition rate at 308, 310 with reduced oxidation and/or nitridation, and a thicker second portion is provided at 312 at a high deposition rate, by which the throughput impact of the low deposition rate at 308 is mitigated. Following the high-k sputter deposition at 306, a gate electrode layer, such as metal or polysilicon, is deposited at 314 over the upper high-k dielectric layer portion, and the gate electrode layer and the high-k dielectric layer are patterned at 316 to form a gate structure, before the gate fabrication method 300 ends at 318.

Figure 7:
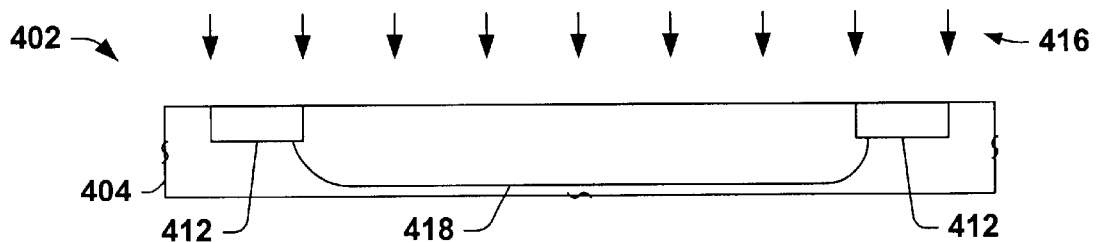
FIGS. 7–11 are partial side elevation views in section illustrating another exemplary semiconductor device being processed at various stages of manufacturing in accordance with the invention.

Referring now to FIGS. 7–11, another exemplary semiconductor device 402 is illustrated undergoing processing at various stages of manufacturing in accordance with the multi-step sputtering aspects of the invention. In FIG. 7, the device 402 is illustrated at an intermediate stage of fabrication, comprising a lightly doped p-type silicon substrate body 404. STI isolation structures 412 (e.g., $SiO_2$) are formed in the body 404, and an n-well 418 is formed in the semiconductor body 404. An optional wet clean or HF deglaze operation 416 may be performed to clean the top surface of the semiconductor body 404. In FIG. 8, a first high-k dielectric layer portion 430a is deposited over the semiconductor body 404 to a thickness 430a' via a first PVD sputter deposition process 432a as illustrated and described above. The first high-k dielectric layer portion 430a comprises any appropriate high-k dielectric material, such as those mentioned above, wherein the thickness 430a' may be a single monolayer up to several tens of Å.

Figure 9:
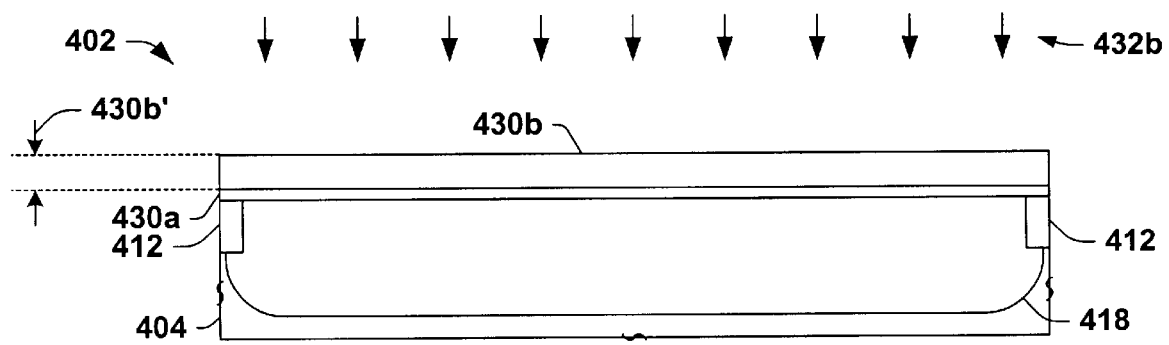
Figure 10:
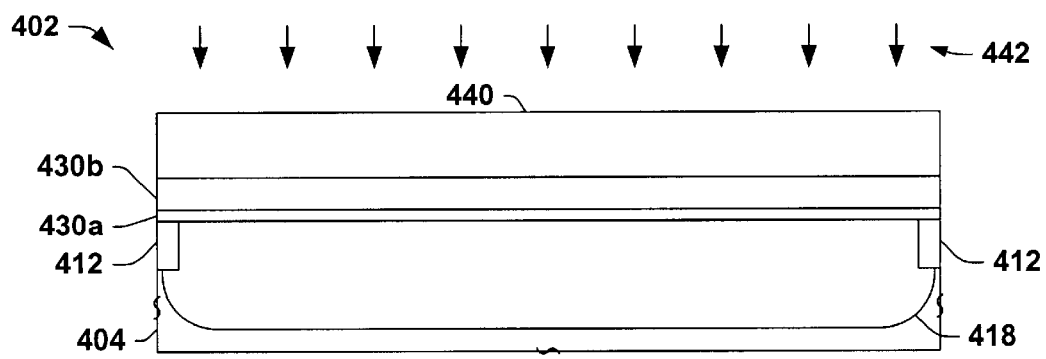
Figure 11:
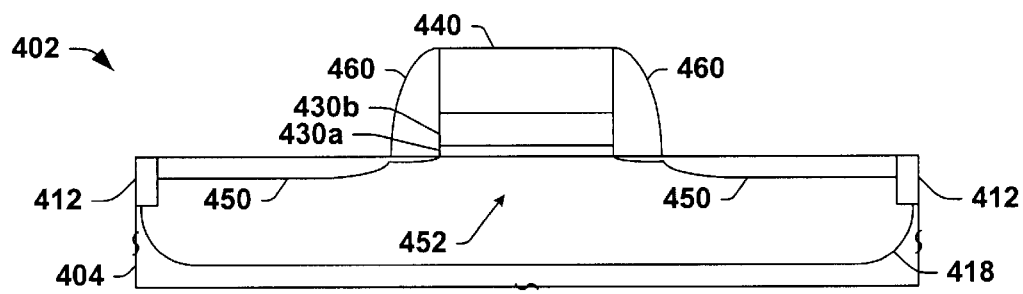

During the first sputtering process 432a, undesirable nitridation and/or oxidation or other adverse reaction of the silicon at the interface between the high-k material 430a and the semiconductor body 404 is minimized or mitigated. For example, the high sputtering deposition pressure, repulsive wafer biasing, increased wafer-plasma spacing, low partial pressures for reactant gases, and/or low sputtering powers or power densities, may be employed alone or in combination, as described above. In FIG. 9, a second sputter deposition process 432b is employed to deposit a second high-k dielectric layer portion 430b having a thickness 430b' of about 10–40 Å, wherein the thickness of the completed high-k gate dielectric layer 430 is approximately 15–50 Å, for example 20–25 Å. Thereafter in FIG. 10, a metal or polysilicon gate electrode layer 440 is deposited over the high-k material 430 via a deposition process 442. In FIG. 11, the gate electrode layer 440 and the high-k dielectric layer 430 are patterned to form a transistor gate structure, source/drain regions 450 are doped with p-type impurities on either side of a channel region 452 in the semiconductor body 404, and sidewall spacers 460 are formed along the sides of the patterned layers 420, 430, and 440. Thereafter, interconnect processing (not shown) is performed to interconnect the illustrated MOS type transistor and other electrical components in the device 402.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a transistor gate structure, comprising:

performing a sputter deposition process to form a high-k dielectric layer over a semiconductor body in a wafer, the high-k dielectric layer comprising a high-k oxide, an oxynitride, or a nitride;

minimizing bombardment of the semiconductor body by positively charged reactive ions during the sputter deposition process;

forming a gate electrode layer over the high-k dielectric layer; and patterning the gate electrode layer and the high-k dielectric layer.

2. The method of claim 1, wherein performing the sputter deposition process comprises controlling a chamber pressure of a sputtering chamber and wherein minimizing bombardment of the semiconductor body comprises controlling the chamber pressure to be about 10 mTorr or more and about 100 mTorr or less.

3. The method of claim 2, wherein minimizing bombardment of the semiconductor body comprises controlling the chamber pressure to be about 30 mTorr or less.

4. The method of claim 1, wherein performing the sputter deposition process comprises biasing the wafer with respect to a plasma potential and wherein minimizing bombardment of the semiconductor body comprises biasing the wafer positive with respect to the plasma potential to repel or retard the kinetic energy of positively charged reactive ions during the sputter deposition process.

5. The method of claim 4, wherein biasing the wafer positive with respect to the plasma potential comprises controlling a potential of the wafer with respect to a sputter deposition system ground.

6. The method of claim 4, wherein minimizing bombardment of the semiconductor body comprises minimizing bombardment by positively charged oxygen or nitrogen ions during the sputter deposition process.

7. The method of claim 1, wherein performing the sputter deposition process comprises locating the wafer in a sputtering chamber and wherein minimizing bombardment of the semiconductor body comprises spacing the wafer from a plasma in the sputtering chamber by a sufficient distance to reduce the energy of positively charged reactive ions hitting the wafer during the sputter deposition process.

8. The method of claim 7, wherein spacing the wafer from the plasma comprises locating the wafer about 100 mm or more away from a target in the sputtering chamber.

9. The method of claim 7, wherein minimizing bombardment of the semiconductor body comprises minimizing bombardment by positively charged oxygen or nitrogen ions during the sputter deposition process.

10. The method of claim 1, wherein performing the sputter deposition process comprises providing at least one reactant gas to a sputtering chamber, the at least one reactant gas being oxygen or nitrogen, and wherein minimizing bombardment of the semiconductor body comprises controlling a pressure of the at least one reactant gas to reduce the amount of positively charged oxygen ions or nitrogen ions hitting the wafer during the sputter deposition process.

11. The method of claim 10, wherein minimizing bombardment of the semiconductor body comprises controlling a pressure of the at least one reactant gas to about 0.1 mTorr or less during the sputter deposition process.

12. The method of claim 11, wherein minimizing bombardment of the semiconductor body comprises controlling a pressure of the at least one reactant gas to about 0.01 mTorr or less during the sputter deposition process.

13. The method of claim 12, wherein the at least one reactant gas is oxygen.

14. The method of claim 12, wherein the at least one reactant gas is nitrogen.

15. The method of claim 1, wherein performing the sputter deposition process comprises controlling a sputtering power density level and wherein minimizing bombardment of the semiconductor body comprises controlling the sputtering power density level to about 0.11 W/cm$^2$ or less.

16. The method of claim 15, wherein minimizing bombardment of the semiconductor body comprises controlling the sputtering power density level to 0.01 W/cm$^2$ or less.

17. The method of claim 1, wherein performing the sputter deposition process comprises:
depositing a first portion of the high-k dielectric layer covering the semiconductor body by sputter deposition; and
depositing a second portion of the high-k dielectric layer over the first portion by sputter deposition;
wherein minimizing bombardment of the semiconductor body comprises minimizing bombardment of the semiconductor body by positively charged reactive ions while depositing the first portion of the high-k dielectric layer.

18. The method of claim 17, wherein minimizing bombardment of the semiconductor body comprises minimizing bombardment by positively charged oxygen or nitrogen ions while depositing the first portion of the high-k dielectric layer.

19. A method of forming a transistor gate, comprising:
depositing a first portion of a high-k dielectric layer over a semiconductor body in a wafer by sputter deposition using a first sputter deposition process, the first portion of the high-k dielectric layer comprising a high-k oxide, an oxynitride, or a nitride;
minimizing adverse reaction of the semiconductor body during the first sputter deposition process;
depositing a second portion of the high-k dielectric layer over the first portion by sputter deposition using a second sputter deposition process, the second portion of the high-k dielectric layer comprising a high-k oxide, an oxynitride, or a nitride;
forming a gate electrode layer over the second portion of the high-k dielectric layer; and
patterning the gate electrode layer and the high-k dielectric layer.

20. The method of claim 19, wherein depositing the first portion of a high-k dielectric layer comprises controlling a chamber pressure of a sputtering chamber and wherein minimizing adverse reaction of the semiconductor body comprises controlling the chamber pressure to be about 10 mTorr or more and about 100 mTorr or less.

21. The method of claim 20, wherein minimizing adverse reaction of the semiconductor body comprises controlling the chamber pressure to be about 30 mTorr or less.

22. The method of claim 19, wherein depositing the first portion of a high-k dielectric layer comprises biasing the wafer with respect to a plasma potential and wherein minimizing adverse reaction of the semiconductor body comprises biasing the wafer positive with respect to the plasma potential to repel or retard the kinetic energy of positively charged reactive ions during the sputter deposition process.

23. The method of claim 22, wherein biasing the wafer positive with respect to the plasma potential comprises controlling a potential of the wafer with respect to a sputter deposition system ground.

24. The method of claim 22, wherein minimizing adverse reaction of the semiconductor body comprises minimizing oxidation or nitridation during the sputter deposition process.

25. The method of claim 19, wherein depositing the first portion of a high-k dielectric layer comprises locating the wafer in a sputtering chamber and wherein minimizing adverse reaction of the semiconductor body comprises spacing the wafer from a plasma in the sputtering chamber by a sufficient distance to reduce the energy of positively charged reactive ions hitting the wafer during the sputter deposition process.

26. The method of claim 25, wherein spacing the wafer from the plasma comprises locating the wafer about 100 mm or more away from a target in the sputtering chamber.

27. The method of claim 25, wherein minimizing adverse reaction of the semiconductor body comprises minimizing oxidation or nitridation during the sputter deposition process.

28. The method of claim 19, wherein depositing the first portion of a high-k dielectric layer comprises providing at least one reactant gas to a sputtering chamber, the at least one reactant gas being oxygen or nitrogen, and wherein minimizing adverse reaction of the semiconductor body comprises controlling a pressure of the at least one reactant gas to reduce the amount of positively charged reactive ions hitting the wafer during the sputter deposition process.

29. The method of claim 28, wherein minimizing adverse reaction of the semiconductor body comprises controlling a pressure of the at least one reactant gas to about 0.1 mTorr or less during the sputter deposition process.

30. The method of claim 29, wherein minimizing adverse reaction of the semiconductor body comprises controlling a pressure of the at least one reactant gas to about 0.01 mTorr or less during the sputter deposition process.

31. The method of claim 30, wherein the at least one reactant gas is oxygen.

32. The method of claim 30, wherein the at least one reactant gas is nitrogen.

33. The method of claim 19, wherein depositing the first portion of a high-k dielectric layer comprises controlling a sputtering power density level and wherein minimizing adverse reaction of the semiconductor body comprises controlling the sputtering power density level to about 0.11 W/cm$^2$ or less.

34. The method of claim 33, wherein minimizing adverse reaction of the semiconductor body comprises controlling the sputtering power density level to 0.01 W/cm$^2$ or less.

35. The method of claim 19, wherein minimizing adverse reaction of the semiconductor body comprises minimizing oxidation or nitridation during the sputter deposition process.

36. A method of forming a high-k dielectric layer over a semiconductor body during fabrication of a transistor gate, the method comprising:
performing a sputter deposition process to form a high-k dielectric layer over a semiconductor body in a wafer, the high-k dielectric layer comprising a high-k oxide, an oxynitride, or a nitride; and
minimizing adverse reaction of the semiconductor body during the sputter deposition process.

37. The method of claim 36, wherein minimizing adverse reaction of the semiconductor body comprises minimizing bombardment of the semiconductor body by positively charged oxygen ions or nitrogen ions during the sputter deposition process.

38. The method of claim 36, wherein performing the sputter deposition process comprises:
depositing a first portion of the high-k dielectric layer covering the semiconductor body by sputter deposition; and depositing a second portion of the high-k dielectric layer over the first portion by sputter deposition;

wherein minimizing adverse reaction of the semiconductor body comprises minimizing oxidation or nitridation of the semiconductor body while depositing the first portion of the high-k dielectric layer.

39. The method of claim 38, wherein minimizing adverse reaction of the semiconductor body comprises minimizing bombardment of the semiconductor body by positively charged oxygen ions or nitrogen ions during the sputter deposition process.

40. The method of claim 36, wherein performing the sputter deposition process comprises controlling a chamber pressure of a sputtering chamber and wherein minimizing adverse reaction of the semiconductor body comprises controlling the chamber pressure to be about 10 mTorr or more and about 100 mTorr or less.

41. The method of claim 40, wherein minimizing adverse reaction of the semiconductor body comprises controlling the chamber pressure to be about 30 mTorr or less.

42. The method of claim 40, wherein performing the sputter deposition process comprises biasing the wafer with respect to a plasma potential and wherein minimizing adverse reaction of the semiconductor body comprises biasing the wafer positive with respect to the plasma potential to repel or retard the kinetic energy of positively charged reactive ions during the sputter deposition process.

43. The method of claim 42, wherein biasing the wafer positive with respect to the plasma potential comprises controlling a potential of the wafer with respect to a sputter deposition system ground.

44. The method of claim 40, wherein performing the sputter deposition process comprises locating the wafer in a sputtering chamber and wherein minimizing adverse reaction of the semiconductor body comprises spacing the wafer from a plasma in the sputtering chamber by a sufficient distance to reduce the energy of positively charged reactive ions hitting the wafer during the sputter deposition process.

45. The method of claim 44, wherein spacing the wafer from the plasma comprises locating the wafer about 100 mm or more away from a target in the sputtering chamber.

46. The method of claim 40, wherein performing the sputter deposition process comprises providing at least one reactant gas to a sputtering chamber, the at least one reactant gas being oxygen or nitrogen, and wherein minimizing adverse reaction of the semiconductor body comprises controlling a pressure of the at least one reactant gas to reduce the amount of positively charged oxygen ions or nitrogen ions hitting the wafer during the sputter deposition process.

47. The method of claim 46, wherein minimizing adverse reaction of the semiconductor body comprises controlling a pressure of the at least one reactant gas to about 0.1 mTorr or less during the sputter deposition process.

48. The method of claim 47, wherein minimizing adverse reaction of the semiconductor body comprises controlling a pressure of the at least one reactant gas to about 0.01 mTorr or less during the sputter deposition process.

49. The method of claim 48, wherein the at least one reactant gas is oxygen.

50. The method of claim 48 wherein the at least one reactant gas is oxygen.

51. The method of claim 40, wherein performing the sputter deposition process comprises controlling a sputtering power density level and wherein minimizing adverse reaction of the semiconductor body comprises controlling the sputtering power density level to about 0.11 W/cm$^2$ or less.

52. The method of claim 51, wherein minimizing adverse reaction of the semiconductor body comprises controlling the sputtering power density level to 0.01 W/cm$^2$ or less.

* * * * *